(12) United States Patent
Lefevre

(10) Patent No.: US 12,113,611 B2
(45) Date of Patent: Oct. 8, 2024

(54) METHOD AND APPARATUS FOR DOWNSTREAM TRANSMISSION

(71) Applicant: Nokia Solutions and Networks Oy, Espoo (FI)

(72) Inventor: Yannick Lefevre, Heverlee (BE)

(73) Assignee: Nokia Solutions and Networks Oy, Espoo (FI)

(*) Notice: Subject to any disclaimer, the term of this patent is extended or adjusted under 35 U.S.C. 154(b) by 127 days.

(21) Appl. No.: 18/061,668

(22) Filed: Dec. 5, 2022

(65) Prior Publication Data

US 2023/0179319 A1    Jun. 8, 2023

(30) Foreign Application Priority Data

Dec. 8, 2021   (EP) ..................................... 21213206

(51) Int. Cl.
  *H04J 14/02*   (2006.01)
  *H04Q 11/00*   (2006.01)
(52) U.S. Cl.
  CPC ...... *H04J 14/0245* (2013.01); *H04Q 11/0067* (2013.01)
(58) Field of Classification Search
  CPC ............. H04J 14/0245; H04Q 11/0067; H04Q 2213/1303; H03M 13/255;
  (Continued)

(56) References Cited

U.S. PATENT DOCUMENTS 5,233,629 A * 8/1993 Paik ................... H04N 21/2383
                                                         329/304
7,376,884 B2 * 5/2008 Lapstun ................ G06F 3/0317
                                                         714/781
(Continued)

FOREIGN PATENT DOCUMENTS

CA        2909311 C  *  5/2022  ............ H03M 13/09
EP        2879297 A1 *  6/2015  .......... H03M 13/116
(Continued)

OTHER PUBLICATIONS

"Higher speed passive optical networks—Common transmission convergence layer specification" Recommendation ITU-T G.9804.2, Sep. 2021.
(Continued)

*Primary Examiner* — Abbas H Alagheband
(74) *Attorney, Agent, or Firm* — Harness, Dickey & Dickey & Pierce, P.L.C.

(57) ABSTRACT

In one embodiment, an apparatus is configured to perform mapping an interleaved bit stream into a sequence of 4-level pulse amplitude modulation (PAM4) labels according to a mapping scheme, with a respective PAM4 label including a least significant bit (LSB) and a most significant bit (MSB) respectively corresponding to a bit in the interleaved bit stream; transmitting a sequence of PAM4 symbols generated based on the sequence of PAM4 labels to the ONUs; and wherein, bits from respective one of the N codewords are assigned to LSBs of a first subset of labels, and to MSBs of a second subset of labels, with the first and the second subset of labels being determined based on the interleaving scheme and the mapping scheme and respectively comprising labels located N labels apart in the sequence of PAM4 labels.

15 Claims, 9 Drawing Sheets

(58) Field of Classification Search
CPC .............. H03M 13/2792; H04L 1/0057; H04L 1/0071; H04L 1/1861; H04B 10/272; H04B 10/516
USPC .......................................................... 398/79
See application file for complete search history.

(56) References Cited

U.S. PATENT DOCUMENTS

| | | | |
|---|---|---|---|
| 10,523,400 B2* | 12/2019 | Lefevre | H04L 1/0061 |
| 10,630,319 B2* | 4/2020 | Chen | H04L 1/0071 |
| 11,356,122 B2* | 6/2022 | Smith | H03M 13/253 |
| 2016/0269810 A1* | 9/2016 | Chow | H04B 10/25891 |
| 2017/0222838 A1* | 8/2017 | Petrov | H03M 13/1165 |
| 2019/0044653 A1* | 2/2019 | Smith | H04B 10/5161 |
| 2020/0177307 A1* | 6/2020 | Pan | H04L 1/0045 |

FOREIGN PATENT DOCUMENTS

| | | | |
|---|---|---|---|
| EP | 3852384 A1 | 7/2021 | |
| WO | WO-2008137719 A1 * | 11/2008 | ......... H04L 25/4919 |
| WO | WO-2021231240 A1 | 11/2021 | |

OTHER PUBLICATIONS

"50-Gigabit-capable passive optical networks (50G-PON): Physical media dependent (PMD) layer specification" Recommendation ITU-T G.9804.3, Sep. 2021.

European Search Report for European Patent Application No. 21213206 dated May 19, 2022.

Xinyuan Wang et la., "Thoughts for 400GbE FEC Architecture with Pre-interleave; wang_x_3bs_01_0915", IEEE Draft; vol. 802.3bs, Sep. 10, 2015, pp. 1-23.

Office Communication for EP Application No. 21 213 206.2 dated May 29, 2024.

* cited by examiner

METHOD AND APPARATUS FOR DOWNSTREAM TRANSMISSION

CROSS-REFERENCE TO RELATED APPLICATIONS

This application claims priority to and the benefit of European Patent Application No. 21213206.2 filed on Dec. 8, 2021, the entire contents of each of which are incorporated herein by reference.

FIELD OF THE INVENTION

Various example embodiments relate to optical networks, specifically to downstream communication in passive optical networks.

BACKGROUND

The new 50G PON G.9804 standard has been accepted by the International Telecommunication Union (ITU). This new standard describes in the G.9804.2 standard, a common transmission convergence (TC) layer for higher speed PON systems, which is intended to be used for future PON technologies. In the G.9804.3 standard, the physical media dependent (PMD) layer is described for a 50G PON systems, with line rates of 50G in downstream (DS) and 12.5G or 25G in upstream (US). It relies on using on-off-keying non-return-to zero (OOK-NRZ) as modulation format, which consists of transmitting one bit per symbol on the line at an approximate 50G baud rate.

A further increase of the data rate to 100G can be achieved by using the same baud rate of 50G but with pulse amplitude modulation with 4 levels (PAM-4) instead of OOK-NRZ symbols. The PAM4 symbols encode 2 bits per symbol on the line. This could be achieved by scaling the TC layer of the G.9804.2 standard, so that it generates bits at the 100G line rate.

It is expected that higher-rate PON channels for 50G and beyond will suffer from inter-symbol interference (ISI) due to for instance chromatic dispersion and bandwidth limited reception. The ISI may be mitigated by using equalization, such as for instance a feed-forward equalizer (FFE) or a decision-feedback equalizer (DFE). The application of such equalizers as well as the ISI itself may cause the noise of the 50G channel to be coloured (i.e., frequency-selective). This may result in a correlation of the noise that subsequent or nearby received modulation symbols experience, and thus also in correlated noise/errors on bits that are transmitted using subsequent or nearby symbols. These correlated errors lead to error bursts, which cause that errors are more concentrated in specific forward error correction (FEC) codewords than would be the case for an ideal, uncorrelated channel. This concentration of errors leads to a degradation of the forward error correction (FEC) code performance, and as a consequence to a sensitivity loss. For 50G PON the FEC code is a low-density parity check (LDPC) code.

To mitigate the impact of the error bursts in the 50G PON channels when OOK-NRZ symbols are used, the G.hsp TC layer (G.9804.2) includes a bit-wise block-interleaving of 4 FEC codewords.

In case of a 100G mode based on PAM4 symbols at a 50G baud rate, the same bit-wise interleaving has undesired impacts, such as insufficient compensation of the full penalty of the error bursts.

SUMMARY OF THE INVENTION

Amongst others, it is an object of embodiments of the present disclosure to provide sufficient mitigation of the impact of the error bursts and retain a good FEC code performance when multi-level PAM is used instead of OOK-NRZ modulation format.

According to a first aspect of the invention, there is provided an apparatus for use by an Optical Line Terminal, OLT, communicatively connected to optical network units, ONUs, comprising means for performing: interleaving a first number N of codewords according to a predetermined interleaving scheme, obtaining an interleaved bit stream, wherein, N is an even number; mapping the interleaved bit stream into a sequence of 4-level pulse amplitude modulation, PAM4, labels according to a predetermined mapping scheme, with a respective PAM4 label comprising a least significant bit, LSB, and a most significant bit, MSB, respectively corresponding to a bit in the interleaved bit stream; transmitting a sequence of PAM4 symbols generated based on the sequence of PAM4 labels to the ONUs; wherein, bits from respective one of the N codewords are assigned to LSBs of a first subset of labels, and to MSBs of a second subset of labels, with the first and the second subset of labels being determined based on the predetermined interleaving scheme and the predetermined mapping scheme and respectively comprising labels located N labels apart in the sequence of PAM4 labels.

In one embodiment, the second subset of labels comprises the labels of the first subset.

In one embodiment, the predetermined interleaving scheme indicates an interleaving step of two bits.

In another embodiment, the second subset of labels comprises labels that are N/2 labels apart from labels of the first subset.

In another embodiment, the predetermined interleaving scheme indicates an interleaving step of one bit; and that, in the interleaved bit stream, bits from respective one of the N codewords are spaced alternatingly with N and N−2 bits from other codewords therebetween.

In another embodiment, wherein the predetermined interleaving scheme indicates an interleaving step of one bit; and wherein, the predetermined mapping scheme comprises inverting the mapping of the interleaved bit stream into PAM4 labels every N/2 PAM4 labels.

In one embodiment, the means are further configured for: sending a message indicating at least one of: the predetermined mapping scheme used by the OLT, or the predetermined interleaving scheme used by the OLT to respective one of the ONUs.

According to a second aspect of the invention, there is provided an apparatus for use by an Optical Network Unit, ONU, communicatively connected to an Optical Line Terminal, OLT, comprising means for performing: receiving a sequence of 4-level pulse amplitude modulation, PAM4, symbols from the OLT; deriving, for a codeword to be processed, from the received sequence of PAM4 symbols, a sequence of pairs of bit indicators, respective one of the pairs corresponding to respective one of the symbols and comprising a least significant bit, LSB, indicator and a most significant bit, MSB, indicator, the sequence of pairs comprising a first subset of pairs and a second subset of pairs, the first and the second subset being determined based on a predetermined de-mapping scheme and a predetermined de-interleaving scheme, and respectively comprising pairs corresponding to PAM4 symbols located N symbols apart in the sequence of PAM4 symbols; determining said codeword based on LSB indicators of the first subset of pairs, and MSB indicators of the second subset of pairs; wherein, the predetermined de-mapping scheme indicates a relationship between bit indicators of a respective pair and the corresponding PAM4 symbol, and the predetermined de-interleaving scheme indicates a de-interleaving step of k bit indicators and a first number N of codewords that are interleaved at the OLT, with N being an even number.

In one embodiment, the determining of said codeword is implemented by: de-mapping the sequence of pairs of bit indicators into a stream of bit indicators according to the predetermined de-mapping scheme; extracting a set of bit indicators related to said codeword from the stream of bit indicators according to the predetermined de-interleaving scheme; determining said codeword based on the set of bit indicators related to said codeword.

In one embodiment, the second subset of pairs comprises the pairs of the first subset.

In another embodiment, the symbols corresponding to the pairs of the second subset are N/2 symbols apart from symbols corresponding to the pairs of the first subset.

In one embodiment, the predetermined de-interleaving scheme and/or predetermined de-mapping scheme is preconfigured in the ONU.

In one embodiment, the means are further configured for: determining the predetermined de-interleaving scheme and/or predetermined de-mapping scheme by trying out a plurality of de-interleaving scheme and/or a plurality of de-mapping scheme preconfigured in the ONU; and/or receiving from the OLT a message indicating at least one of: the predetermined mapping scheme used by the OLT, or the predetermined interleaving scheme used by the OLT.

According to a third aspect of the invention, there is provided a method, for use by an Optical Line Terminal, OLT, communicatively connected to optical network units, ONUs, comprising: interleaving a first number N of codewords according to a predetermined interleaving scheme, obtaining an interleaved bit stream, wherein, N is an even number; mapping the interleaved bit stream into a sequence of 4-level pulse amplitude modulation, PAM4, labels according to a predetermined mapping scheme, with a respective PAM4 label comprising a least significant bit, LSB, and a most significant bit, MSB, respectively corresponding to a bit in the interleaved bit stream; transmitting a sequence of PAM4 symbols generated based on the sequence of PAM4 labels to the ONUs; wherein, bits from respective one of the N codewords are assigned to LSBs of a first subset of labels, and to MSBs of a second subset of labels, with the first and the second subset of labels being determined based on the predetermined interleaving scheme and the predetermined mapping scheme and respectively comprising labels located N labels apart in the sequence of PAM4 labels.

According to a fourth aspect of the invention, there is provided a method, for use by an Optical Network Unit, ONU, communicatively connected to an Optical Line Terminal, OLT, comprising: receiving a sequence of 4-level pulse amplitude modulation, PAM4, symbols from the OLT; deriving, for a codeword to be processed, from the received sequence of PAM4 symbols, a sequence of pairs of bit indicators, respective one of the pairs corresponding to respective one of the symbols and comprising a least significant bit, LSB, indicator and a most significant bit, MSB, indicator, the sequence of pairs comprising a first subset of pairs and a second subset of pairs, the first and the second subset being determined based on a predetermined de-mapping scheme and a predetermined de-interleaving scheme, and respectively comprising pairs corresponding to PAM4 symbols located N symbols apart in the sequence of PAM4 symbols; determining said codeword based on LSB indicators of the first subset of pairs, and MSB indicators of the second subset of pairs; wherein, the predetermined de-mapping scheme indicates a relationship between bit indicators of a respective pair and the corresponding PAM4 symbol, and the predetermined de-interleaving scheme indicates a de-interleaving step of k bit indicators and a first number N of codewords that are interleaved at the OLT, with N being an even number.

According to the example embodiments, the distance between PAM4 labels, the LSBs/MSBs of which correspond to bits from the same FEC codeword, is the same as the number of codewords that are interleaved, which provides maximal mitigation of error bursts. Meanwhile, bits from same codeword are assigned to both MSBs and LSBs of same or different labels, which ensure a good FEC code performance.

BRIEF DESCRIPTION OF THE FIGURES

For a more complete understanding of example embodiments of the present invention, reference is now made to the following descriptions taken in connection with the accompanying drawings in which.

Same or similar reference numerals refer to same or similar parts or components.

DETAILED DESCRIPTION

Figure 1:
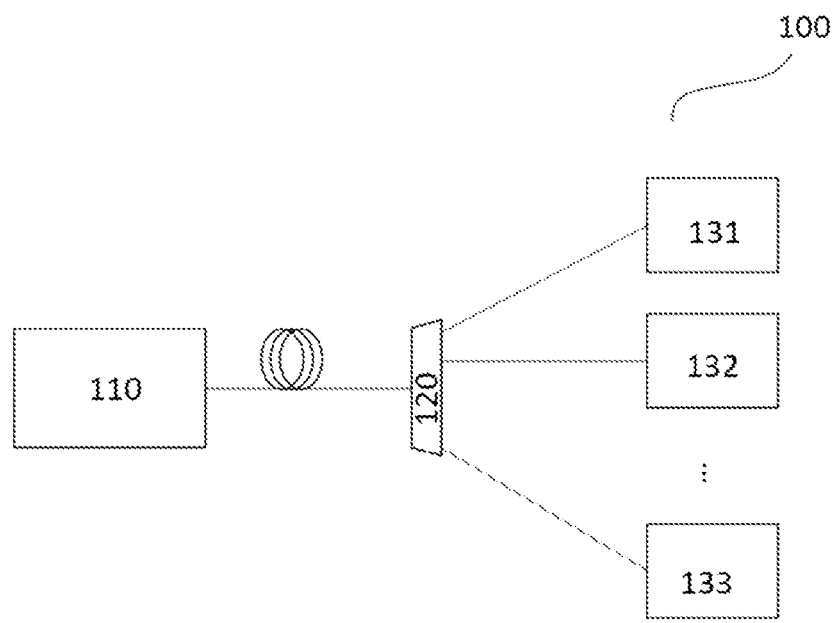
FIG. 1 shows a part of an exemplifying communication network in which examples of disclosed embodiments may be applied.

Example embodiments of the present application are described herein in detail and shown by way of example in the drawings. It should be understood that, although specific embodiments are discussed herein there is no intent to limit the scope of the invention to such embodiments. To the contrary, it should be understood that the embodiments discussed herein are for illustrative purposes, and that modified and alternative embodiments may be implemented without departing from the scope of the invention as defined in the claims. The sequence of method steps is not limited to the specific embodiments, the method steps may be performed in other possible sequence. Similarly, specific structural and functional details disclosed herein are merely representative for purposes of describing the embodiments. The invention described herein, however, may be embodied in many alternate forms and should not be construed as limited to only the embodiments set forth herein.

FIG. 1 shows a part of an exemplifying communication network in which examples of disclosed embodiments may be applied.

As shown in FIG. 1 in a passive optical network, PON, 100, an OLT 110 at the network side is used to connect to a plurality of ONUs 131, 132, . . . , 133 at the user side by means of an optical distribution network (ODN) or fiber plant 120 that contains optical fibers and splitters, but no active components. A skilled person shall understand the number of ONUs is not limited to the given example. The OLT 110 may be connected to for example up to 64 ONUs.

Most PON technologies such as G-PON, E-PON, and XG(S)-PON are time-division multiplexing (TDM) PON technologies, in which the fiber medium is shared in time between the different ONUs. In addition, time- and wavelength-division multiplexing (TWDM) PON technologies exist, such as next-generation NG-PON2, in which multiple TDM systems at different wavelength are stacked on the same PON system. Example embodiments apply to both TDM and TWDM PON systems.

Figure 2:
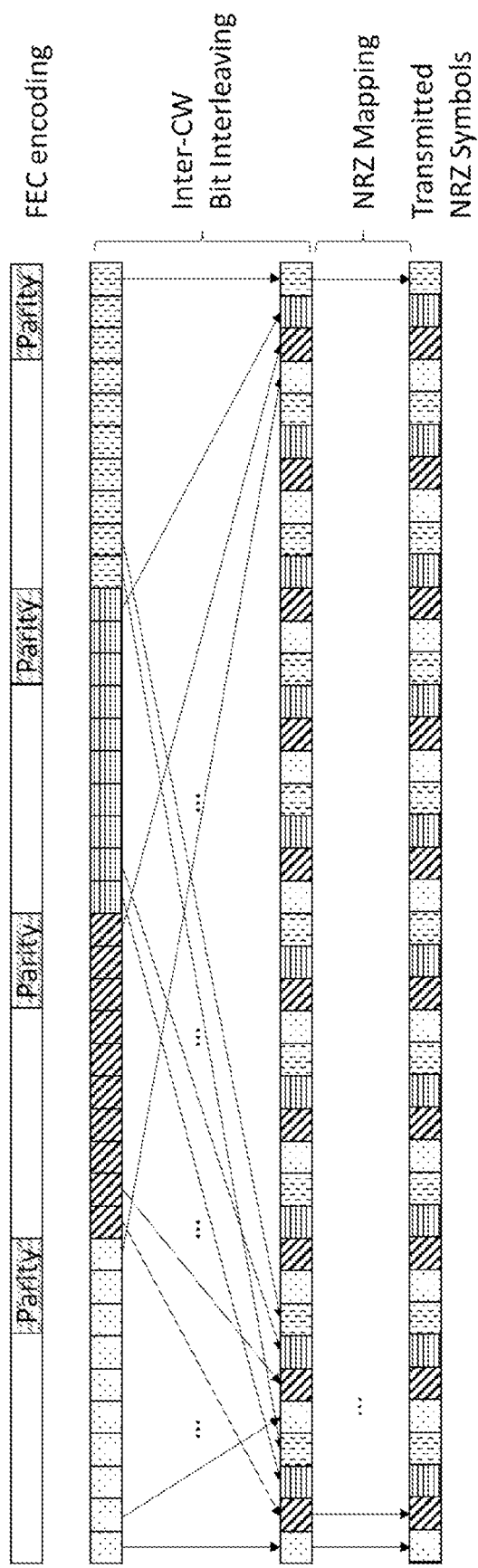
FIG. 2 shows an example construction of a frame according to prior art.

FIG. 2 shows an example construction of a frame according to prior art.

As shown in FIG. 2, after FEC encoding, FEC codewords comprise FEC data and parity. The FEC encoding may be carried out according to a way described in the standard and will not be elaborated here. In some example scenario, the FEC codewords may be further scrambled, for example, XORed with a known sequence, into scrambled codewords and form thereby a scrambled PHY frame.

In the example shown in FIG. 2, 4 FEC codewords are bit-wise interleaved into an interleaved bit stream. Then bits in the interleaved bit stream are mapped into a sequence of NRZ symbols before being transmitted. This block interleaver ensures that bits encoded by the same codeword are transmitted 4 symbols apart. As a consequence, any burst of up to 4 errors will be distributed over 4 different FEC codewords, causing the LDPC code performance to approach that of the decoding performance in case of uncorrelated errors. Here it is necessary to interleave over 4 codewords to compensate the full error burst penalty, as interleaving over less codewords, for instance 2, and thus placing bits of the same FEC codewords 2 symbols apart, is insufficient for typical 50G PON channels.

Figure 3:
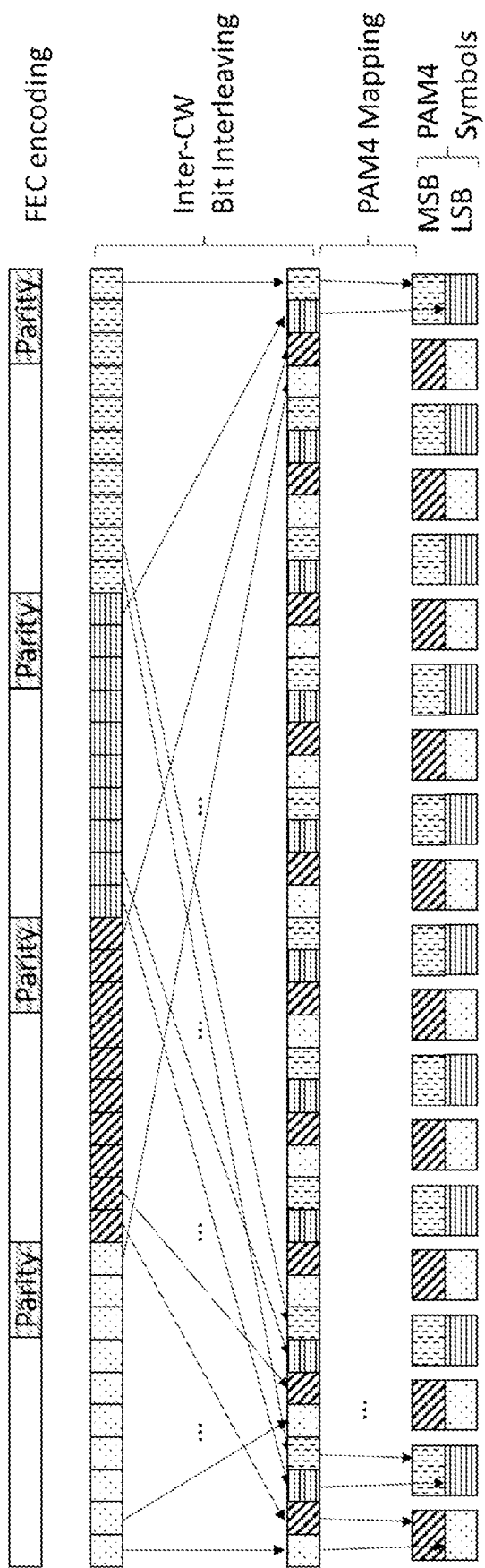
FIG. 3 shows an example construction of a frame when PAM4 is adopted in the example of FIG. 2.

FIG. 3 shows an example construction of a frame when PAM4 is adopted in the example of FIG. 2.

As shown in FIG. 3, the interleaved bit stream is mapped into a sequence of PAM4 labels which are used to generate symbols before being transmitted.

Since each PAM4 label comprises two bits, one LSB, and one MSB, the bits from the interleaved bit stream are preferably mapped to the PAM4 labels in blocks of two bits. In other words, the first two bits of the interleaved bit-stream are mapped to the first label, the second two to the second label, and so on. In one example, it is considered that the LSB is mapped first, and then the MSB (although this can be inverse without loss of generality). The bit-wise block interleaving of 4 codewords results now in a transmitted symbol sequence with the following two characteristics:

The bits of one codeword are transmitted only 2 symbols apart, instead of 4. In other words, the same interleaving as for NRZ leads to less mitigation of the impact of the error bursts. As a consequence, the same interleaving will be insufficient to compensate the full penalty of the error bursts.

Each codeword contains only MSBs or only LSBs. For example, bits from the codeword marked with dotted pattern are assigned to LSBs only, and the codeword marked with diagonal stripes are assigned to MSBs only. Generally, the LSBs are less protected than the MSBs, and experiences a larger bit error rate (BER). As a consequence, the codewords with only LSBs will have a higher codeword error rate than the codewords that would contain a mix of MSBs and LSBs. Although the codeword error rate of the MSB-only codewords would be better, on average this will cause a degradation of the codeword error rate and thus of the sensitivity compared to when the MSBs and LSBs would be mixed in the codewords.

Figure 4:
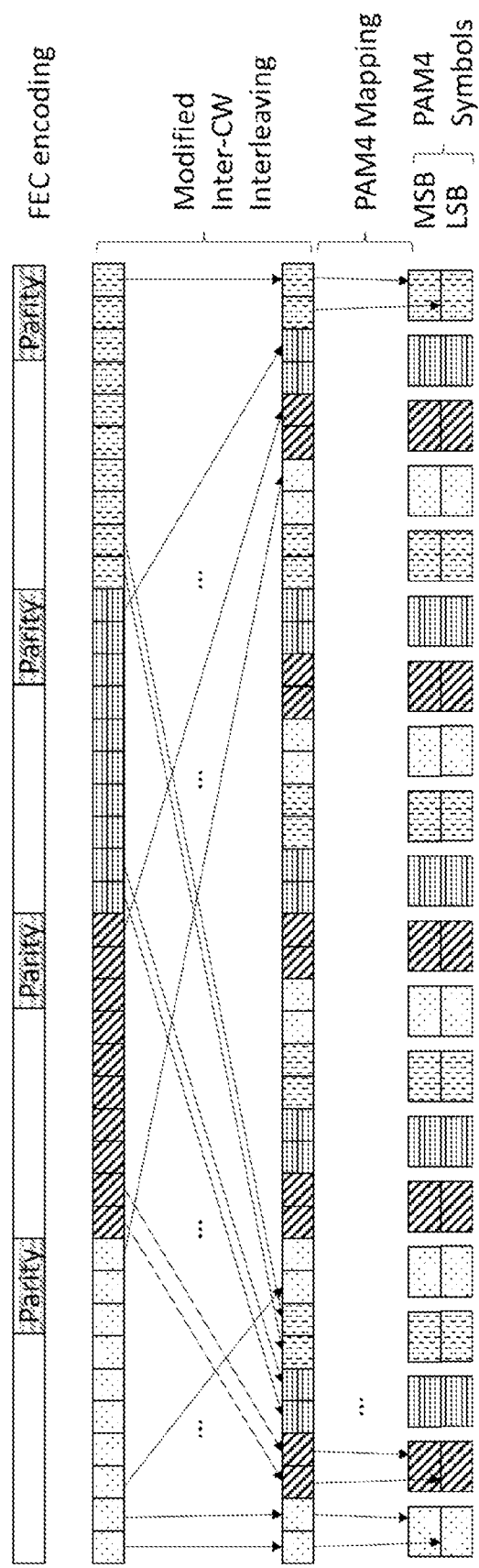
FIG. 4 shows an example construction of a frame according to an example embodiment.

FIG. 4 shows an example construction of a frame according to an example embodiment.

According to the example shown in FIG. 4, 4 codewords are interleaved according to a predetermined interleaving scheme, obtaining an interleaved bit stream. In the following, the first codeword marked with dotted pattern may be referred to as codeword 1, the second codeword marked with diagonal stripes may be referred to as codeword 2, the third codeword marked with horizontal stripes may be referred to as codeword 3, and the fourth codeword marked with alternating vertical lines may be referred to as codeword 4. A skilled person should understand that the number of codewords given here is merely an example, in other embodiments, a first number of N codewords are interleaved according to the predetermined interleaving scheme, wherein, N is an even number. The codewords interleaved may be FEC codewords or scrambled codewords as described with respect to FIG. 2. Detailed elaboration will not be repeated here.

The interleaved bit stream is mapped into a sequence of PAM4 labels according to a predetermined mapping scheme. Each PAM4 label comprises a LSB and a MSB. The LSB and MSB respectively correspond to a bit in the interleaved bit stream.

Bits from respective one of the N codewords are assigned to LSBs of a first subset of labels, and to MSBs of a second subset of labels. The first and the second subset of labels are determined for respective one of the N codewords based on the predetermined interleaving scheme and the predetermined mapping scheme. The first subset of labels comprises labels located N labels apart in the sequence of PAM4 labels. The second subset of labels comprises labels located N labels apart in the sequence of PAM4 labels.

Specifically, in the example shown in FIG. 4, for codeword 1, the first subset comprises the $1^{st}$, $5^{th}$, $9^{th}$, $13^{th}$ and $17^{th}$ labels in the sequence of PAM4 labels, and the second subset comprises the $1^{st}$, $5^{th}$, $9^{th}$, $13^{th}$ and $17^{th}$ labels in the sequence of PAM4 labels as well. In the example shown in FIG. 4, the second subset of labels comprises the labels of the first subset. There are different ways of configuring the predetermined interleaving scheme and the predetermined mapping scheme, so that the second subset of labels may comprise the labels of the first subset.

More specifically, in the embodiment shown in FIG. 4, the predetermined interleaving scheme indicates an interleaving step of two bits. For example, a block interleaver may be implemented to interleave the 4 codewords in step of two bits. In other words, bits are taken from the codewords in the sequence: 1-1-2-2-3-3-4-4-1-1 . . . to form the interleaved bit stream.

Still referring to the example shown in FIG. 4, the predetermined mapping scheme may indicate a mapping scheme in blocks of two bits, similar as described with respect to FIG. 3. Specifically, in the example shown in FIG. 4, the interleaved bit stream is mapped into a sequence of PAM4 labels by sequentially mapping every two consecutive bits from the interleaved bit stream into one PAM4 label, with the bit having the earlier bit position in the interleaved bit stream being assigned to the LSB of the PAM4 label, and the bit having the later bit position in the interleaved bit stream being assigned to the MSB of the PAM4 label. For example, the first bit in the interleaved bit stream is mapped to LSB of the first PAM4 label. The second bit in the interleaved bit stream is mapped to MSB of the first PAM4 label.

In other implementations, the mapping may be inverted. For example, among the two consecutive bits mapped to the same PAM4 label, the bit having the earlier bit position in the interleaved bit stream may be assigned to the MSB of the PAM4 label, and the bit having the later bit position in the interleaved bit stream may be assigned to the LSB of the PAM4 label.

Subsequently, a sequence of PAM4 symbols is generated based on the sequence of PAM4 labels before being transmitted to the ONUs, for example the ONUs 131, 132, 133 in FIG. 1.

In an example, a label Bb (where B is MSB, and b is LSB) may be converted to PAM4 signals in the following way: label 00 is converted to signal level 0, 01 to 1, 11 to 2, and 10 to 3.

With this approach, the 2 consecutive bits of the same codeword are always mapped to the same PAM4 symbol (i.e., the MSB and LSB of the same PAM4 symbol come from the same FEC codeword), and the PAM4 symbols containing bits from the same FEC codeword are spaced 4 symbols apart. In this way, the same interleaving performance is maintained as for NRZ (i.e., interleaving N codewords removes the impact of error/noise correlation up to N symbols long).

Upon receiving the sequence of PAM4 symbols from the OLT 110, the ONU, for example any one of the ONUs 131, 132, 133 in FIG. 1, derives, for a codeword to be processed, from the received sequence of PAM4 symbols, a sequence of pairs of bit indicators. Respective one of the pairs corresponds to respective one of the symbols and comprises a LSB indicator and a MSB indicator. The bit indicators may be values related to the likelihood of transmitted bits, or binary values related to transmitted bits. The sequence of pairs comprises a first subset of pairs and a second subset of pairs. The first and the second subset are determined based on the predetermined de-mapping scheme and the predetermined de-interleaving scheme. The first subset of pairs comprises pairs corresponding to PAM4 symbols located N symbols apart in the sequence of PAM4 symbols, and the second subset of pairs comprises pairs corresponding to PAM4 symbols located N symbols apart in the sequence of PAM4 symbols.

Specifically, in an example, the ONU may perform a hard de-mapping, namely, PAM4 symbols are de-mapped into bit values. In this example, the pairs of bit indicators may be considered as PAM4 labels as described above with respect to the OLT. In another embodiment, the ONU may perform a soft de-mapping, i.e., the PAM4 symbols are de-mapped to log likelihood ratios (llr) of transmitted bits.

In an example, the ONU may perform full processing of the sequence of PAM4 symbols. The ONU may convert all the PAM4 symbols into pairs of bit indicators.

In another example, the ONU may process only part of the codewords. The ONU may determine, for respective one of the codeword to be processed, a first and a second subset of pairs of bit indicators based on the predetermined de-mapping scheme and the predetermined de-interleaving scheme. For each codeword to be processed, the ONU may convert part of the PAM4 symbols into pairs of bit indicators, to obtain the sequence of pairs comprising the first subset and the second subset of pairs determined for that codeword.

After obtaining the sequence of pairs comprising the first subset and the second subset of pairs, the ONU determines the codeword to be processed, based on LSB indicators of the first subset of pairs, and MSB indicators of the second subset of pairs.

The predetermined de-mapping scheme indicates a relationship between bit indicators of a respective pair and the corresponding PAM4 symbol, and the predetermined de-interleaving scheme indicates a de-interleaving step of k bit indicators and a first number N of codewords that are interleaved at the OLT, with N being an even number. In other words, the predetermined de-mapping scheme indicates how two bit indicators are recovered from respective one of the received PAM4 symbols. In case of a hard de-mapping, bits may be determined directly based on the relationship of PAM4 levels and PAM4 labels, for example, as previously described. In case of a soft de-mapping, the relationship of PAM4 levels and PAM4 labels may be used to calculate the likelihood for the relevant bits.

The first subset and the second subset of pairs respectively comprises pairs corresponding to PAM4 symbols located N symbols apart in the sequence of PAM4 symbols. Consequently, the distance between symbols corresponding to the LSB indicators, likewise, the distance between symbols corresponding to the MSB indicators, that are used to recover the codeword to be processed, is the same as the number of codewords that are interleaved, which provides maximal mitigation of error bursts. Meanwhile, the codeword is recovered both from MSB indicators and LSB indicators, which ensure a good FEC code performance.

Specifically, in one embodiment, the determining of the codeword to be processed may be implemented by de-mapping the sequence of pairs of bit indicators into a stream of bit indicators according to the predetermined de-mapping scheme; extracting a set of bit indicators related to said codeword from the stream of bit indicators according to the predetermined de-interleaving scheme; determining said codeword based on the set of bit indicators related to said codeword. A skilled person should understand that the extracted set of bit indicators related to said codeword may comprise the LSB indicators of the first subset of pairs, and MSB indicators of the second subset of pairs.

In an example, the ONU may obtain a stream of bit indicators that comprises bit indicators comprised in the pairs of the first subset or the second subset, and place holder values for the bit indicators not comprised in the pairs of the first subset or the second subset. Alternatively, the ONU may obtain a stream of bit indicators, that only comprises bit indicators comprised in the pairs of the first subset or the second subset, and no values for the other bit indicators. In yet another embodiment, the ONU may obtain a stream of bit indicators that comprises bit indicators of all the pairs.

In one embodiment, the predetermined de-mapping scheme and the predetermined de-interleaving scheme may be preconfigured in the ONU. For example, the predetermined de-mapping scheme and the predetermined de-interleaving scheme may be defined in the standard and supported by both OLT and ONUs. In another embodiment, the predetermined de-interleaving scheme and/or predetermined de-mapping scheme may be determined by trying out a plurality of de-interleaving scheme and/or a plurality of de-mapping scheme preconfigured in the ONU. For example, a plurality of different de-mapping scheme and/or de-interleaving scheme may be defined in the standard and pre-configured in the ONU by manufacturing according to design. During operation, the ONU may try out the different de-mapping scheme and/or de-interleaving scheme to detect a known synchronization pattern in the frame, such as the PSync pattern at the beginning of the frame as defined for 50G in G.9804.2, thereby determining the de-mapping scheme and/or de-interleaving scheme it shall use for the de-mapping and the de-interleaving. In yet another embodiment, the OLT may send to the ONUs a message indicating at least one of: the predetermined mapping scheme used by the OLT, or the predetermined interleaving scheme used by the OLT. Accordingly, the ONU may determine the predetermined de-interleaving scheme and/or predetermined de-mapping scheme based on the message received from the OLT.

In the following, specific examples will be described considering hard de-mapping is used. "PAM4 labels" may be used as an example for "pairs of bit indicators"

Specifically, in the example shown in FIG. 4, the predetermined de-interleaving scheme may indicate a de-interleaving step of two bits. The predetermined de-mapping scheme may indicate a de-mapping to two bits, for instance with LSB-first de-mapping. Based on the predetermined de-mapping scheme and the predetermined de-interleaving scheme, the ONU may determine the first subset and second subset for the codeword 1 as both comprising the $1^{st}$, $5^{th}$, $9^{th}$, $13^{th}$ and $17^{th}$ labels in the sequence of PAM4 labels. A skilled person should understand there are also other possible configuration of the predetermined de-mapping scheme and the predetermined de-interleaving scheme that may cause the second subset of labels comprises labels of the first subset. For example, in an example, the predetermined de-mapping scheme may indicate a de-mapping to two bits with MSB-first de-mapping.

In the scenario where the ONU needs to perform full de-interleaving, the interleaved bit stream may be de-interleaved into N codewords.

In the scenario where the ONU does not need to perform full de-interleaving, the ONU may retrieve LSBs from the first subset of labels and retrieve MSBs from the second subset of labels and form thereby at least one codeword, for example, a codeword intended for the ONU itself.

In the embodiments described above, the first subset and the second subset of labels are the same. However, in other examples, the first subset may be different from the second subset. A skilled person shall understand that the shortest distance in position between a label from the first subset and a label from the second subset corresponding to the same codeword may vary from 0 to N/2 labels. In the following, embodiments where the second subset of labels comprises labels that are N/2 labels apart from the labels of the first subset will be described.

Figure 5:
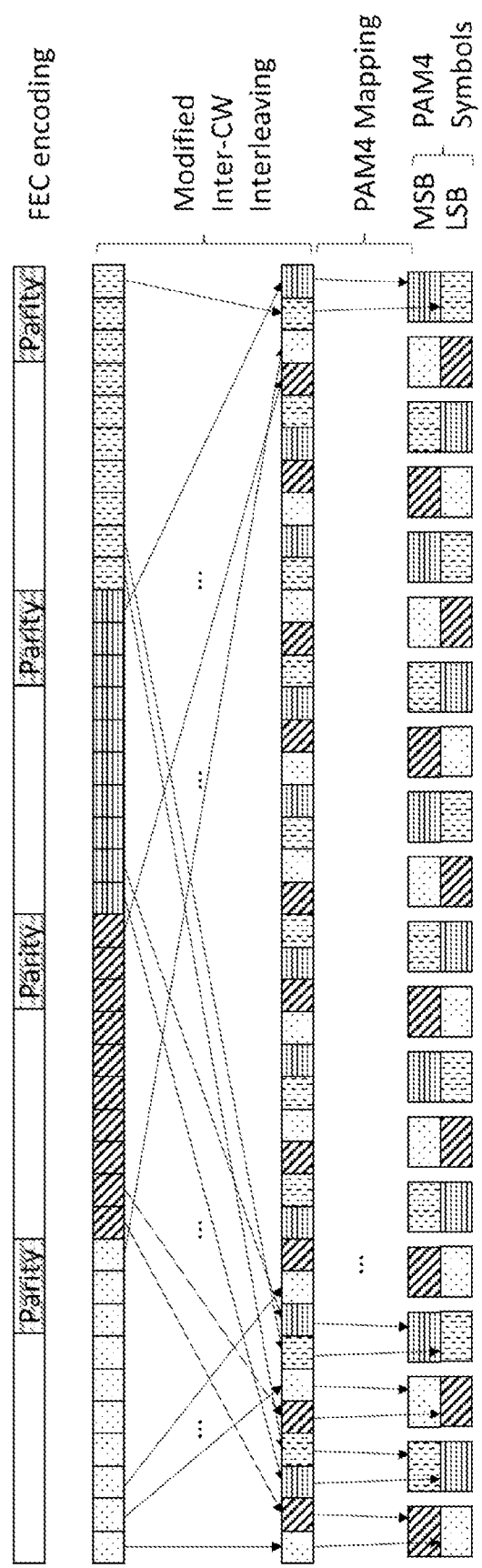
FIG. 5 shows an example construction of a frame according to another example embodiment.

FIG. 5 shows an example construction of a frame according to another example embodiment.

In FIG. 5, features similar as those described with respect to the previous figures will not be repeated. Specifically, in the example shown in FIG. 5, the second subset of labels comprises labels that are 2 labels apart from the labels of the first subset. For example, for codeword 1, the first subset, to the LSBs of which the bits from codeword 1 are assigned, comprises the $1^{st}$, $5^{th}$, $9^{th}$, $13^{th}$ and $17^{th}$ labels in the sequence of PAM4 labels, and the second subset, to the MSBs of which the bits from codeword 1 are assigned, comprises the $3^{st}$, $7^{th}$, $11^{th}$, $15^{th}$ and $19^{th}$ labels in the sequence of PAM4 labels.

In the embodiment shown in FIG. 5, the predetermined interleaving scheme indicates that the first number N of codewords are interleaved in steps of one bit, and that, in the interleaved bit stream, bits from respective one of the N codewords are spaced alternatingly with N and N−2 bits from other codewords therebetween.

For example, in FIG. 5, bits from codeword 1 are interleaved into bit position 1, 6, 9, 14, 17, . . . in the interleaved bit stream. The first bit and the second bit from codeword 1 are spaced with 4 bits from other codewords therebetween, namely bits from codewords 2, 3, 4, and 2. The second bit and the third bit from codeword 1 are spaced with 2 bits from other codewords therebetween, namely bits from codewords 3 and 4. The third bit and the fourth bit from codeword 1 are spaced again with 4 bits from other codewords therebetween, and so on.

A skilled person should understand, there are different ways of configuring the predetermined de-mapping scheme and the predetermined de-interleaving scheme that may cause bits from respective one of the N codewords are spaced alternatingly with N and N−2 bits from other codewords therebetween.

Specifically, for example, the first number N of codewords may be grouped into N/2 groups of two adjacent codewords. Each group is interleaved into a sequence of blocks each comprising two sequential bits in the interleaved bit stream. The sequence of bits of a first codeword and a second codeword from respective group may be switched in every second of its corresponding bit blocks in the interleaved bit stream.

For example, in FIG. 5, the first group may comprise the codeword 1 and codeword 2, and the second group may comprise codeword 3 and codeword 4. The bit blocks corresponding to the first group may comprise the bits in bit position 1, 2, 5, 6, 9, 10 . . . in the interleaved bit stream. The bit blocks corresponding to the second group may comprise the bits in bit position 3, 4, 7, 8, 11, 12 . . . in the interleaved bit stream.

Specifically, the interleaver may be implemented as a block interleaver that for the first four bits is equivalent to the bit-wise interleaver as described with respect to FIGS. 2 and 3. Bits 5 and 6 are however switched, with bit 5 coming from codeword 2 and bit 6 from codeword 1. Similarly, bits 7 and 8 are also switched, with bit 7 coming from codeword 4 and 8 from codeword 3. In other words, the bits are taken from the codewords in the sequence: 1-2-3-4-2-1-4-3-1-2- . . . .

In the example shown in FIG. 5, the predetermined mapping scheme may indicate a mapping scheme similar as described with respect to FIGS. 3 and 4. Thereby, bit blocks corresponding to a respective group are mapped into respective PAM4 labels. For example, bit blocks corresponding to the first group may be mapped into the $1^{st}$, $3^{rd}$, $5^{th}$ . . . labels in the sequence of PAM4 labels, and bit blocks corresponding to the second group may be mapped into the $2^{nd}$, $4^{th}$, $6^{th}$ . . . labels in the sequence of PAM4 labels.

With this modified interleaver, and the described mapping to PAM4 symbols, bits of single codewords are mapped to LSBs that are in symbols that are 4 symbols apart, and to MSBs that are also in symbols that are 4 symbols apart. The MSBs and LSBs coming from the same codeword are placed 2 symbols apart. In other words, this implementation has similar characteristics as the previous one of FIG. 4, but now the LSBs and MSBs are not in the same PAM 4 symbols, but are in PAM4 symbols that are as much separated as possible (i.e., each MSB of a codeword is in a symbol that is in the middle between 2 PAM4 symbols that contain LSBs of that codeword). Hence, this interleaving is expected to give a further performance improvement as there is less correlation between the MSBs and LSBs in a codeword.

Similar as described above with respect to FIG. 4, the sequence of PAM4 labels is converted into a sequence of PAM symbols and transmitted to the ONUs.

Upon receiving the of PAM4 symbols from the OLT 110, the ONU performs similar operation as described with respect to FIG. 4, to recover at least one codeword.

Specifically, in the embodiment shown in FIG. 5, the symbols corresponding to the pairs of the second subset are N/2 symbols apart from symbols corresponding to the pairs of the first subset.

More specifically, the predetermined de-interleaving scheme may indicate an interleaving step of one bit, and that in the interleaved bit stream, bits spaced alternatingly with N and N−2 bits therebetween are deinterleaved into respective one of the N codewords. In the example shown in FIG. 5, the predetermined de-mapping scheme may indicate a LSB-first de-mapping to two bits. In another example, the predetermined de-mapping scheme may indicate a MSB-first de-mapping to two bits.

In the example shown in FIG. 5, the ONU, for example any one of the ONUs 131, 132, 133 in FIG. 1, determines for codeword 1 the first subset as comprising the $1^{st}$, $5^{th}$, $9^{th}$, $13^{th}$, $17^{th}$ . . . labels in the sequence of PAM4 labels, and the second subset as comprising the $3^{st}$, $7^{th}$, $11^{th}$, $15^{th}$ $0.19^{th}$ . . . labels in the sequence of PAM4 labels, based on the predetermined de-mapping scheme and the predetermined de-interleaving scheme. In one example, the predetermined de-mapping may indicate a LSB-first de-mapping to two bits. Then LSBs of the first subset of labels and MSBs of the second subset of labels are de-mapped into $1^{st}$, $6^{th}$, $9^{th}$, $14^{th}$, $17^{th}$ . . . bit positions in the interleaved bit stream.

Here, in the example of FIG. 5, the bits in $1^{st}$, $6^{th}$, $9^{th}$, $14^{th}$, $17^{th}$ . . . bit positions in the interleaved bit stream are deinterleaved into codeword 1. Additionally or alternatively, the bits in $2^{nd}$, $5^{th}$, $10^{th}$, $13^{th}$, $18^{th}$ . . . bit positions in the interleaved bit stream are deinterleaved into codeword 2, and so on.

Figure 6:
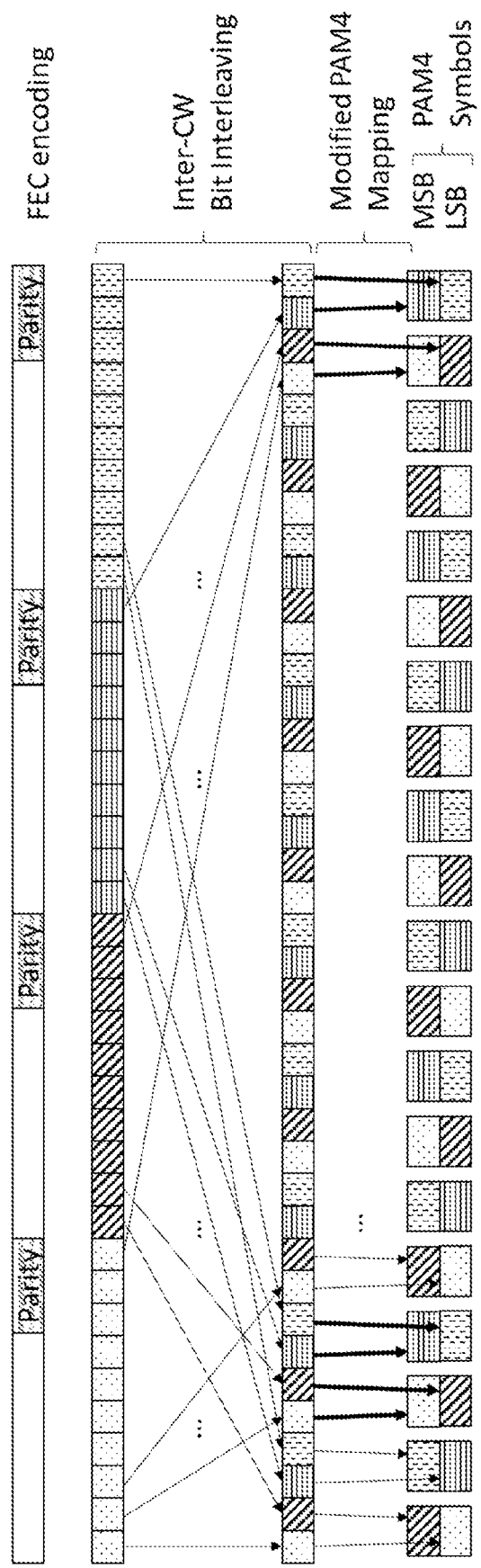
FIG. 6 shows an example construction of a frame according to yet another example embodiment.

FIG. 6 shows an example construction of a frame according to yet another example embodiment.

In FIG. 6, features similar as those described with respect to the previous figures will not be repeated. In this embodiment, the second subset of labels also comprises labels that are 2 labels apart from the labels of the first subset, similar as in the embodiment shown in FIG. 5.

Specifically, in the example shown in FIG. 6, the predetermined interleaving scheme indicates that the first number N of codewords are interleaved in steps of one bit, and that predetermined mapping scheme comprises inverting the mapping of the interleaved bit stream into PAM4 labels every N/2 PAM4 labels.

More specifically, a bit-wise block interleaver as described with respect to FIGS. 2 and 3 may be implemented. While the mapping from the interleaved bit stream into a sequence of PAM4 labels is different from the mapping described in the previous Figures. As shown in the FIG. 6, the LSB is mapped first in the first two PAM4 labels, while the MSB is mapped first in the following third and fourth PAM4 labels. For the fifth and sixth PAM4 label, the LSB is again mapped first. Thicker arrows are used to indicate the inverted mapping in the third and fourth PAM4 labels. The mapping is inverted every 2 PAM4 labels.

This interleaving and modified mapping leads to the same PAM4 symbols as in FIG. 5, and thus has the same advantages.

Similar as described above with respect to FIG. 4, the sequence of PAM4 labels is converted into a sequence of PAM symbols and transmitted to the ONUs.

Upon receiving the sequence of PAM4 symbols from the OLT 110, the ONU, for example any one of the ONUs 131, 132, 133 in FIG. 1, performs similar operation as described with respect to FIGS. 4 and 5, to recover at least one codeword.

Specifically, similar as described with respect to FIG. 5, for codeword 1, the ONU may determine the first subset as comprising the $1^{st}$, $5^{th}$, $9^{th}$, $13^{th}$, $17^{th}$ . . . labels in the sequence of PAM4 labels, and the second subset as comprising the $3^{st}$, $7^{th}$, $11^{th}$, $15^{th}$ $0.19^{th}$ . . . labels in the sequence of PAM4 labels, based on the predetermined de-mapping scheme and the predetermined de-interleaving scheme.

Specifically for the embodiment described with respect to FIG. 6, the predetermined de-mapping scheme may indicate that the de-mapping of the PAM4 labels into interleaved bit stream is inverted every 2 PAM4 labels.

For example, in FIG. 6, the first two PAM4 labels are de-mapped with LSBs being first de-mapped. The third and the fourth PAM4 labels are de-mapped with MSBs being first de-mapped. The fifth and sixth PAM4 labels are de-mapped again with LSBs being first de-mapped, and so on.

Further referring to the embodiment described with respect to FIG. 6, the predetermined de-interleaving scheme indicates a de-interleaving step of one bit. For example, a block de-interleaver may be implemented at the ONU. After the sequence of PAM4 labels is de-mapped into an interleaved bit stream according to the predetermined de-mapping scheme, the interleaved bit stream is bit-wise de-interleaved. Similar as above described with respect to FIGS. 4 and 5, in the scenario where the ONU needs to perform full de-interleaving, the interleaved bit stream may be de-interleaved into N codewords. In the scenario where the ONU does not need to perform full de-interleaving, the ONU may retrieve LSBs from the first subset of labels and retrieve MSBs from the second subset of labels and form thereby at least one codeword, for example, a codeword intended for the ONU itself.

Although not claimed in the claims, a skilled person may also adapt the interleaving and the mapping scheme, for use in the scenario where multi-level PAM symbols, for example PAM8 symbols, are used instead of PAM4 symbols, so that the bits from the same codeword are assigned to log 2M subsets of PAM-M labels, wherein for a respective subset the bits are assigned to bit position with the same significance in the label, and wherein the labels of a respective subset are N labels apart in the sequence of PAM-M, with N being same as the number of the codewords that are interleaved.

Various embodiments may be applied to time-division multiplexing, TDM, PON technologies, such as gigabit PON, G-PON, ethernet PON, E-PON, 10 gigabit symmetrical PON, XGS-PON, and higher speed PONs. Furthermore, the proposed technique may be applied as well to time- and wavelength-division multiplexing, TWDM, PON technologies in which TDM systems at different wavelengths are stacked on the same PON system. One or more wavelengths in the TWDM PON system then operate as per the present disclosure.

Figure 7:
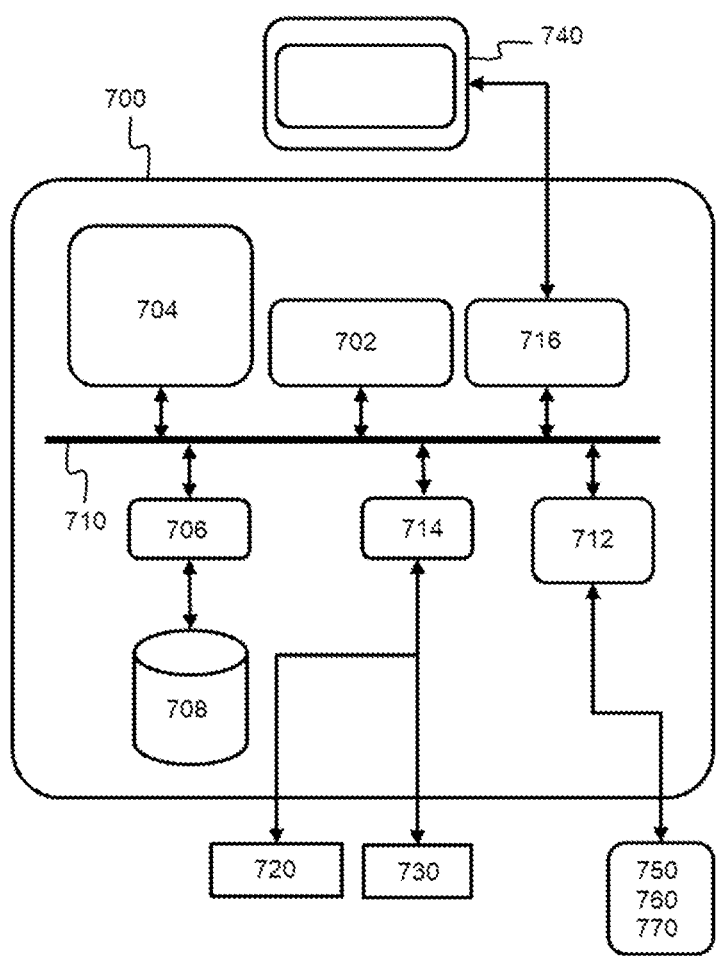
FIG. 7 shows an example embodiment of a suitable computing system for performing one or several steps in various embodiments.

FIG. 7 shows a computing system 700 comprising at least one processor; and at least one memory including computer program code, the at least one memory and computer program code configured to, with the at least one processor, cause the performance of the apparatus. The computing system 700 may in general be formed as a suitable general-purpose computer and comprise a bus 710, a processor 702, a local memory 704, one or more optional input interfaces 714, one or more optional output interfaces 716, a communication interface 712, a storage element interface 706, and one or more storage elements 708. Bus 710 may comprise one or more conductors that permit communication among the components of the computing system 700. Processor 702 may include any type of conventional processor or microprocessor that interprets and executes programming instructions. Local memory 704 may include a random-access memory, RAM, or another type of dynamic storage device that stores information and instructions for execution by processor 702 and/or a read only memory, ROM, or another type of static storage device that stores static information and instructions for use by processor 702. Input interface 714 may comprise one or more conventional mechanisms that permit an operator or user to input information to the computing device 700, such as a keyboard 720, a mouse 730, a pen, voice recognition and/or biometric mechanisms, a camera, etc. Output interface 716 may comprise one or more conventional mechanisms that output information to the operator or user, such as a display 740, etc. Communication interface 712 may comprise any transceiver-like mechanism such as for example one or more Ethernet interfaces that enables computing system 700 to communicate with other devices and/or systems, for example with other computing devices 750, 760, 770. The communication interface 712 of computing system 700 may be connected to such another computing system by means of a local area network, LAN, or a wide area network, WAN, such as for example the internet. Storage element interface 706 may comprise a storage interface such as for example a Serial Advanced Technology Attachment, SATA, interface or a Small Computer System Interface, SCSI, for connecting bus 710 to one or more storage elements 708, such as one or more local disks, for example SATA disk drives, and control the reading and writing of data to and/or from these storage elements 708. Although the storage element(s) 708 above is/are described as a local disk, in general any other suitable computer-readable media such as a removable magnetic disk, optical storage media such as a CD or DVD, -ROM disk, solid state drives, flash memory cards, . . . could be used. The computing system 700 may be materialized as, or may comprise, an Application Specific Integrated Circuit (ASIC), an Application Specific Instruction set Processor (ASIP), a Field Programmable Gate Array (FPGA), a Digital Signal Processor (DSP) based system or a combination thereof.

Such a computing system 700 is suitable for performing various steps performed by an OLT in an optical network according to various embodiments of the present disclosure. According to the present disclosure, the communication interface 712 allows an OLT according to various embodiments of the present disclosure to exchange control information and data with the ONUs in the PON. According to the example embodiments, the processor may be running a computer program code which allows the OLT to control the construction of the frames. More specifically, the program code performs the steps of: interleaving a first number N of codewords according to a predetermined interleaving scheme, obtaining an interleaved bit stream, wherein, N is an even number; mapping the interleaved bit stream into a sequence of 4-level pulse amplitude modulation, PAM4, labels according to a predetermined mapping scheme, with a respective PAM4 label comprising a least significant bit, LSB, and a most significant bit, MSB, respectively corresponding to a bit in the interleaved bit stream; transmitting a sequence of PAM4 symbols generated based on the sequence of PAM4 labels to the ONUs; wherein, bits from respective one of the N codewords are assigned to LSBs of a first subset of labels, and to MSBs of a second subset of labels, with the first and the second subset of labels being determined based on the predetermined interleaving scheme and the predetermined mapping scheme and respectively comprising labels located N labels apart in the sequence of PAM4 labels.

Furthermore, the computing system 700 is also suitable for performing various steps performed by an ONU in an optical network according to various embodiments of the present disclosure. According to the present disclosure, the communication interface 712 allows an ONU according various embodiments of the present disclosure to receive control information and exchange data with an OLT in the PON. According to the example embodiments, the processor may be running a computer program code which allows the ONU to control the decoding of the received frame. More specifically, the program code performs the steps of: receiving a sequence of 4-level pulse amplitude modulation, PAM4, symbols from the OLT; deriving, for a codeword to be processed, from the received sequence of PAM4 symbols, a sequence of pairs of bit indicators, respective one of the pairs corresponding to respective one of the symbols and comprising a least significant bit, LSB, indicator and a most significant bit, MSB, indicator, the sequence of pairs comprising a first subset of pairs and a second subset of pairs, the first and the second subset being determined based on a predetermined de-mapping scheme and a predetermined de-interleaving scheme, and respectively comprising pairs corresponding to PAM4 symbols located N symbols apart in the sequence of PAM4 symbols; determining said codeword based on LSB indicators of the first subset of pairs, and MSB indicators of the second subset of pairs; wherein, the predetermined de-mapping scheme indicates a relationship between bit indicators of a respective pair and the corresponding PAM4 symbol, and the predetermined de-interleaving scheme indicates a de-interleaving step of k bit indicators and a first number N of codewords that are interleaved at the OLT, with N being an even number.

Figure 8:
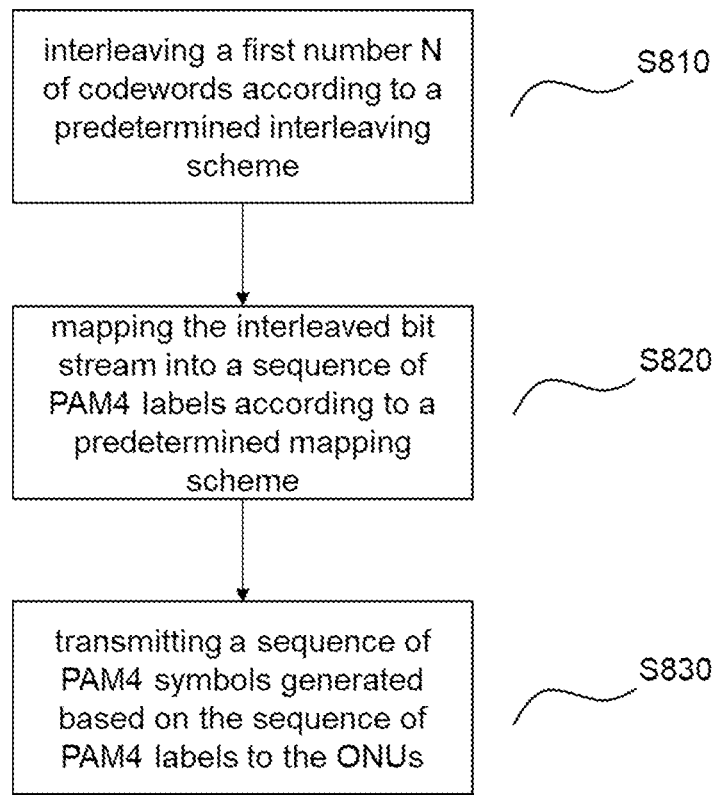
FIG. 8 shows an example method 800 incorporating aspects of the example embodiments.

FIG. 8 shows an example method 800 incorporating aspects of the example embodiments.

In step S810, an OLT implementing aspects of the example embodiments interleaves a first number N of codewords according to a predetermined interleaving scheme, obtaining an interleaved bit stream, wherein, N is an even number.

In step S820, the OLT maps the interleaved bit stream into a sequence of PAM4 labels according to a predetermined mapping scheme, with a respective PAM4 label comprising a LSB and a MSB. The LSB and the MSB respectively corresponding to a bit in the interleaved bit stream.

With the cooperation of the interleaving in step S810 and the mapping in step S820, bits from respective one of the N codewords are assigned to LSBs of a first subset of labels, and to MSBs of a second subset of labels, with the first and the second subset of labels being determined based on the predetermined interleaving scheme and the predetermined mapping scheme. The first subset of labels comprises labels located N labels apart in the sequence of PAM4 labels, and the second subset of labels comprises labels located N labels apart in the sequence of PAM4 labels.

In step S830, the OLT transmits a sequence of PAM4 symbols generated based on the sequence of PAM4 labels to the ONUs.

Figure 9:
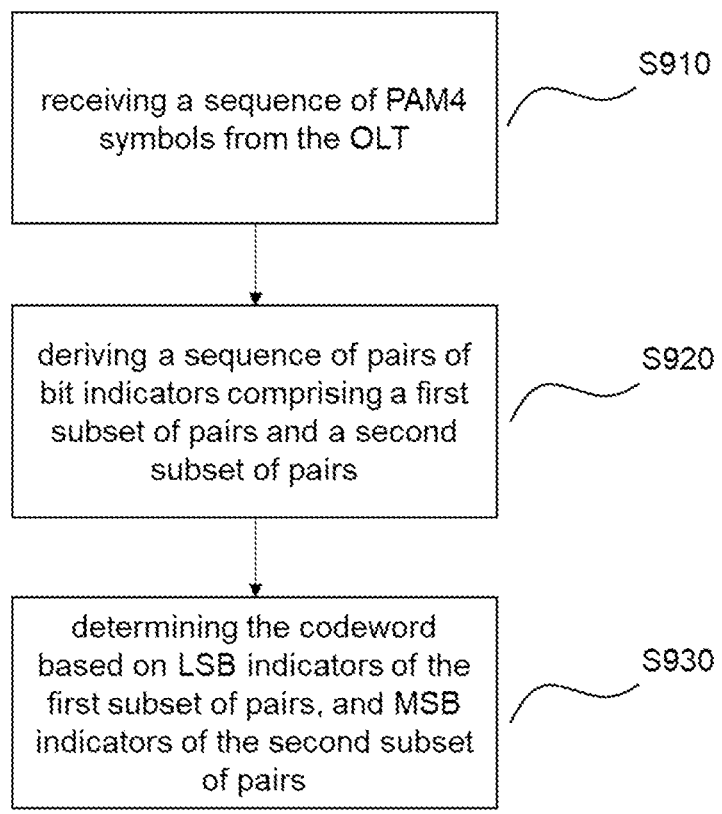
FIG. 9 shows another example method 900 incorporating aspects of the example embodiments.

FIG. 9 shows another example method 900 incorporating aspects of the example embodiments.

In step S910, an ONU implementing aspects of the example embodiments, for example, any one of ONU 131, 132 or 133 in FIG. 1, receives a sequence of PAM4 symbols from the OLT, for example the OLT 110 in FIG. 1.

In step S920, for a codeword to be processed, the ONU derives from the received sequence of PAM4 symbols, a sequence of pairs of bit indicators. Respective one of the pairs corresponds to respective one of the symbols and comprises a LSB indicator and a MSB indicator. The sequence of pairs comprises a first subset of pairs and a second subset of pairs. The first and the second subset are determined based on a predetermined de-mapping scheme and a predetermined de-interleaving scheme. The first subset of pairs comprises pairs corresponding to PAM4 symbols located N symbols apart in the sequence of PAM4 symbols. The second subset of pairs comprises pairs corresponding to PAM4 symbols located N symbols apart in the sequence of PAM4 symbols In step S930, the ONU determining said codeword based on LSB indicators of the first subset of pairs, and MSB indicators of the second subset of pairs.

The predetermined de-mapping scheme indicates a relationship between bit indicators of a respective pair and the corresponding PAM4 symbol, and the predetermined de-interleaving scheme indicates a de-interleaving step of k bit indicators and a first number N of codewords that are interleaved at the OLT, with N being an even number.

The present embodiments are to be considered in all respects as illustrative and not restrictive, the scope of the invention being indicated by the appended claims rather than by the foregoing description, and all changes which come within the scope of the claims are therefore intended to be embraced therein.

If desired, the different functions discussed herein may be performed in a different order and/or concurrently with each other. Furthermore, if desired, one or more of the above-described functions may be optional or may be combined.

It will be obvious to a person skilled in the art that, as the technology advances, the inventive concept can be implemented in various ways. The invention and its embodiments are not limited to the examples described above but may vary within the scope of the claims.

It will furthermore be understood by the reader of this patent application that the words "comprising" or "comprise" do not exclude other elements or steps, that the words "a" or "an" do not exclude a plurality, and that a single element, such as a computer system, a processor, or another integrated unit may fulfil the functions of several means recited in the claims. Any reference signs in the claims shall not be construed as limiting the respective claims concerned. The terms "first", "second", third", and the like, when used in the description or in the claims are introduced to distinguish between similar elements or steps and are not necessarily describing a sequential or chronological order. Similarly, the terms "top", "bottom", "over", "under", and the like are introduced for descriptive purposes and not necessarily to denote relative positions. It is to be understood that the terms so used are interchangeable under appropriate circumstances and embodiments of the invention are capable of operating according to the present invention in other sequences, or in orientations different from the one(s) described or illustrated above.

The invention claimed is:

1. An apparatus for use by an Optical Line Terminal (OLT) communicatively connected to optical network units (ONUs), comprising:
at least one memory storing computer program code; and
at least one processor configured to execute the computer program code and cause the apparatus to perform,
interleaving a first number N of codewords according to an interleaving scheme, obtaining an interleaved bit stream, wherein, N is an even number;
mapping the interleaved bit stream into a sequence of 4-level pulse amplitude modulation (PAM4) labels according to a mapping scheme, with a respective PAM4 label comprising a least significant bit (LSB) and a most significant bit (MSB) respectively corresponding to a bit in the interleaved bit stream;
transmitting a sequence of PAM4 symbols generated based on the sequence of PAM4 labels to the ONUs;
wherein, bits from respective one of the N codewords are assigned to LSBs of a first subset of labels, and to MSBs of a second subset of labels, with the first and the second subset of labels being determined based on the interleaving scheme and the mapping scheme and respectively comprising labels located N labels apart in the sequence of PAM4 labels.

2. The apparatus according to claim 1, wherein, the second subset of labels comprises the labels of the first subset.

3. The apparatus according to claim 2, the interleaving scheme indicates an interleaving step of two bits.

4. The apparatus according to claim 1, wherein, the second subset of labels comprises labels that are N/2 labels apart from labels of the first subset.

5. The apparatus according to claim 4, wherein
the interleaving scheme indicates an interleaving step of one bit;
and that, in the interleaved bit stream, bits from respective one of the N codewords are spaced alternatingly with N and N−2 bits from other codewords therebetween.

6. The apparatus according to claim 4, wherein
the interleaving scheme indicates an interleaving step of one bit;
and wherein, the mapping scheme comprises inverting the mapping of the interleaved bit stream into PAM4 labels every N/2 PAM4 labels.

7. The apparatus according to claim 1, wherein the apparatus is further caused to perform
sending a message indicating at least one of,
the mapping scheme used by the OLT, or
the interleaving scheme used by the OLT
to respective one of the ONUs.

8. An apparatus, for use by an Optical Network Unit (ONU) communicatively connected to an Optical Line Terminal (OLT), comprising:
at least one memory storing computer program code; and
at least one processor configured to execute the computer program code and cause the apparatus to perform,
receiving a sequence of 4-level pulse amplitude modulation (PAM4) symbols from the OLT;
deriving, for a codeword to be processed, from the received sequence of PAM4 symbols, a sequence of pairs of bit indicators, respective one of the pairs corresponding to respective one of the symbols and comprising a least significant bit (LSB) indicator and a most significant bit (MSB) indicator, the sequence of pairs comprising a first subset of pairs and a second subset of pairs, the first and the second subset being determined based on a de-mapping scheme and a de-interleaving scheme, and respectively comprising pairs corresponding to PAM4 symbols located N symbols apart in the sequence of PAM4 symbols;

determining said codeword based on LSB indicators of the first subset of pairs, and MSB indicators of the second subset of pairs;

wherein, the de-mapping scheme indicates a relationship between bit indicators of a respective pair and the corresponding PAM4 symbol, and the de-interleaving scheme indicates a de-interleaving step of k bit indicators and a first number N of codewords that are interleaved at the OLT, with N being an even number.

9. The apparatus according to claim 8, wherein the determining of said codeword is implemented by:
- de-mapping the sequence of pairs of bit indicators into a stream of bit indicators according to the de-mapping scheme;
- extracting a set of bit indicators related to said codeword from the stream of bit indicators according to the de-interleaving scheme;
- determining said codeword based on the set of bit indicators related to said codeword.

10. The apparatus according to claim 8, wherein the second subset of pairs comprises the pairs of the first subset.

11. The apparatus according to claim 8, wherein, the symbols corresponding to the pairs of the second subset are N/2 symbols apart from symbols corresponding to the pairs of the first subset.

12. The apparatus according to claim 8, wherein the de-interleaving scheme and/or the de-mapping scheme is preconfigured in the ONU.

13. The apparatus according to claim 8, wherein the apparatus is further caused to perform,
- determining the de-interleaving scheme and/or the de-mapping scheme by
  - trying out a plurality of de-interleaving schemes and/or a plurality of de-mapping schemes preconfigured in the ONU; and/or
  - receiving from the OLT a message indicating at least one of a mapping scheme used by the OLT, or a interleaving scheme used by the OLT.

14. A method, for use by an Optical Line Terminal (OLT) communicatively connected to optical network units (ONUs) comprising:
- interleaving a first number N of codewords according to an interleaving scheme, obtaining an interleaved bit stream, wherein, N is an even number;
- mapping the interleaved bit stream into a sequence of 4-level pulse amplitude modulation (PAM4) labels according to a mapping scheme, with a respective PAM4 label comprising a least significant bit (LSB) and a most significant bit (MSB) respectively corresponding to a bit in the interleaved bit stream;
- transmitting a sequence of PAM4 symbols generated based on the sequence of PAM4 labels to the ONUs;

wherein, bits from respective one of the N codewords are assigned to LSBs of a first subset of labels, and to MSBs of a second subset of labels, with the first and the second subset of labels being determined based on the interleaving scheme and the mapping scheme and respectively comprising labels located N labels apart in the sequence of PAM4 labels.

15. A method, for use by an Optical Network Unit (ONUs) communicatively connected to an Optical Line Terminal (OLT) comprising:
- receiving a sequence of 4-level pulse amplitude modulation (PAM4) symbols from the OLT;
- deriving, for a codeword to be processed, from the received sequence of PAM4 symbols, a sequence of pairs of bit indicators, respective one of the pairs corresponding to respective one of the symbols and comprising a least significant bit (LSB) indicator and a most significant bit (MSB) indicator, the sequence of pairs comprising a first subset of pairs and a second subset of pairs, the first and the second subset being determined based on a de-mapping scheme and a de-interleaving scheme, and respectively comprising pairs corresponding to PAM4 symbols located N symbols apart in the sequence of PAM4 symbols;
- determining said codeword based on LSB indicators of the first subset of pairs, and MSB indicators of the second subset of pairs;

wherein, the de-mapping scheme indicates a relationship between bit indicators of a respective pair and the corresponding PAM4 symbol, and the de-interleaving scheme indicates a de-interleaving step of k bit indicators and a first number N of codewords that are interleaved at the OLT, with N being an even number.

* * * * *